(12) United States Patent
Chen et al.

(10) Patent No.: US 9,443,836 B2
(45) Date of Patent: Sep. 13, 2016

(54) FORMING PIXEL UNITS OF IMAGE SENSORS THROUGH BONDING TWO CHIPS

(71) Applicant: Taiwan Semiconductor Manufacturing Company, Ltd., Hsin-Chu (TW)

(72) Inventors: Szu-Ying Chen, Toufen Township (TW); Meng-Hsun Wan, Taipei (TW); Tzu-Jui Wang, Fengshan (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/550,410

(22) Filed: Nov. 21, 2014

(65) Prior Publication Data

US 2015/0079718 A1 Mar. 19, 2015

Related U.S. Application Data

(63) Continuation of application No. 13/486,724, filed on Jun. 1, 2012, now Pat. No. 9,153,565.

(51) Int. Cl.
| | |
|---|---|
| H01L 27/14 | (2006.01) |
| H01L 25/00 | (2006.01) |
| H01L 27/146 | (2006.01) |
| H01L 21/768 | (2006.01) |
| H01L 25/18 | (2006.01) |

(52) U.S. Cl.
CPC ......... *H01L 25/50* (2013.01); *H01L 21/76898* (2013.01); *H01L 25/18* (2013.01); *H01L 27/1464* (2013.01); *H01L 27/14609* (2013.01); *H01L 27/14634* (2013.01); *H01L 27/14685* (2013.01); *H01L 2924/0002* (2013.01)

(58) Field of Classification Search
CPC . H01L 25/50; H01L 27/76898; H01L 25/18; H01L 27/14609; H01L 27/1464; H01L 27/14634; H01L 2924/0002
See application file for complete search history.

(56) References Cited

U.S. PATENT DOCUMENTS

| | | |
|---|---|---|
| 7,119,322 B2 | 10/2006 | Hong |
| 7,336,808 B2 | 2/2008 | Mizuno et al. |
| 7,470,893 B2 | 12/2008 | Suzuki et al. |
| 7,495,206 B2 | 2/2009 | Park |
| 7,965,329 B2 | 6/2011 | McCarten et al. |
| 8,049,256 B2 | 11/2011 | Guidash |
| 8,193,023 B2 | 6/2012 | Ahn |
| 8,325,221 B2 | 12/2012 | Lee |
| 8,558,292 B2 | 10/2013 | Guidash |
| 8,629,524 B2 | 1/2014 | Wang et al. |

(Continued)

FOREIGN PATENT DOCUMENTS

| | | |
|---|---|---|
| EP | 1617480 A2 | 1/2006 |
| JP | 2003232679 | 8/2003 |

(Continued)

*Primary Examiner* — Tony Ko
(74) *Attorney, Agent, or Firm* — Slater Matsil, LLP

(57) ABSTRACT

A device includes a first chip including an image sensor therein, and a second chip bonded to the first chip. The second chip includes a logic device selected from the group consisting essentially of a reset transistor, a selector, a row selector, and combinations thereof therein. The logic device and the image sensor are electrically coupled to each other, and are parts of a same pixel unit.

20 Claims, 7 Drawing Sheets

(56) References Cited

U.S. PATENT DOCUMENTS

| | | |
|---|---|---|
| 2003/0214595 A1 | 11/2003 | Mabuchi |
| 2004/0263668 A1 | 12/2004 | Kim et al. |
| 2005/0110159 A1 | 5/2005 | Oh et al. |
| 2005/0133021 A1 | 6/2005 | Kobayashi |
| 2005/0275418 A1 | 12/2005 | Chong et al. |
| 2006/0146233 A1 | 7/2006 | Park |
| 2006/0278992 A1 | 12/2006 | Trezza et al. |
| 2007/0045836 A1 | 3/2007 | Kwon et al. |
| 2007/0181780 A1 | 8/2007 | Suzuki et al. |
| 2008/0083939 A1 | 4/2008 | Guidash |
| 2008/0203452 A1 | 8/2008 | Moon et al. |
| 2008/0272464 A1 | 11/2008 | Do et al. |
| 2009/0200624 A1 | 8/2009 | Dai et al. |
| 2010/0013907 A1 | 1/2010 | Lee |
| 2010/0238334 A1 | 9/2010 | Takahashi |
| 2010/0248412 A1 | 9/2010 | Guidash |
| 2010/0258890 A1 | 10/2010 | Ahn |
| 2010/0276572 A1 | 11/2010 | Iwabuchi et al. |
| 2011/0121420 A1 | 5/2011 | Yang |
| 2011/0159634 A1 | 6/2011 | Oshiki et al. |
| 2011/0163223 A1 | 7/2011 | Guidash |
| 2011/0260221 A1 | 10/2011 | Mao et al. |
| 2012/0199930 A1 | 8/2012 | Hayashi |
| 2013/0068929 A1 | 3/2013 | Solhusvik et al. |
| 2013/0099098 A1* | 4/2013 | Kobayashi ........ H01L 27/14632 250/208.1 |
| 2013/0107075 A1 | 5/2013 | Kobayashi et al. |
| 2013/0264467 A1 | 10/2013 | Hong et al. |
| 2013/0292548 A1 | 11/2013 | Agranov et al. |
| 2014/0042298 A1 | 2/2014 | Wan et al. |
| 2014/0042299 A1 | 2/2014 | Wan et al. |
| 2014/0113398 A1 | 4/2014 | Wang et al. |

FOREIGN PATENT DOCUMENTS

| | | |
|---|---|---|
| JP | 2003338615 A | 11/2003 |
| JP | 2006191081 | 7/2006 |
| JP | 2007228460 A | 9/2007 |
| JP | 2008066410 A | 3/2008 |
| KR | 20040110296 | 12/2004 |
| KR | 1020060011429 | 2/2006 |
| KR | 1020060011845 | 2/2006 |
| KR | 2007093450 | 8/2007 |
| KR | 100825808 | 4/2008 |
| KR | 1020090065980 | 6/2009 |
| KR | 1020090077904 | 7/2009 |
| WO | 2004105137 | 12/2004 |
| WO | 2006856512 | 8/2006 |
| WO | 2008045356 | 4/2008 |
| WO | 2012001911 A1 | 1/2012 |
| WO | 2012004965 | 1/2012 |

\* cited by examiner

FORMING PIXEL UNITS OF IMAGE SENSORS THROUGH BONDING TWO CHIPS

PRIORITY CLAIM AND CROSS-REFERENCE

This application is a continuation of U.S. patent application Ser. No. 13/486,724, entitled "Image Sensors with a High Fill-Factor," filed on Jun. 1, 2012, which application is incorporated herein by reference.

BACKGROUND

Backside Illumination (BSI) image sensor chips are replacing front-side illumination sensor chips for their higher efficiency in capturing photons. In the formation of BSI image sensor chips, image sensors (such as photo diodes) and logic circuits are formed on a silicon substrate of a wafer, followed by the formation of an interconnect structure on a front side of a silicon chip. The wafer is then thinned, and backside structures such as color filters and micro-lenses are formed on the backside of the silicon substrate.

The image sensors in the BSI image sensor chips generate electrical signals in response to the stimulation of photons. The magnitudes of the electrical signals (such as the currents) depend on the intensity of the incident light received by the respective image sensors. To increase the quantum efficiency of image sensors, the image sensors are preferably to occupy a high percent of the chip area that is used by the pixel units, which pixel units include the image sensors. Due to the fact that the pixel units also include additional devices besides the image sensors, including, for example, transfer gate transistors, reset transistors, source followers, and row selectors, the improvement in the quantum efficiency is limited.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A stacked image sensor chip/wafer and the method of forming the same are provided in accordance with various exemplary embodiments. The intermediate stages of forming the stacked image sensor chip and the respective stacked wafer are illustrated. The variations of the embodiments are discussed. Throughout the various views and illustrative embodiments, like reference numbers are used to designate like elements.

Figure 1:
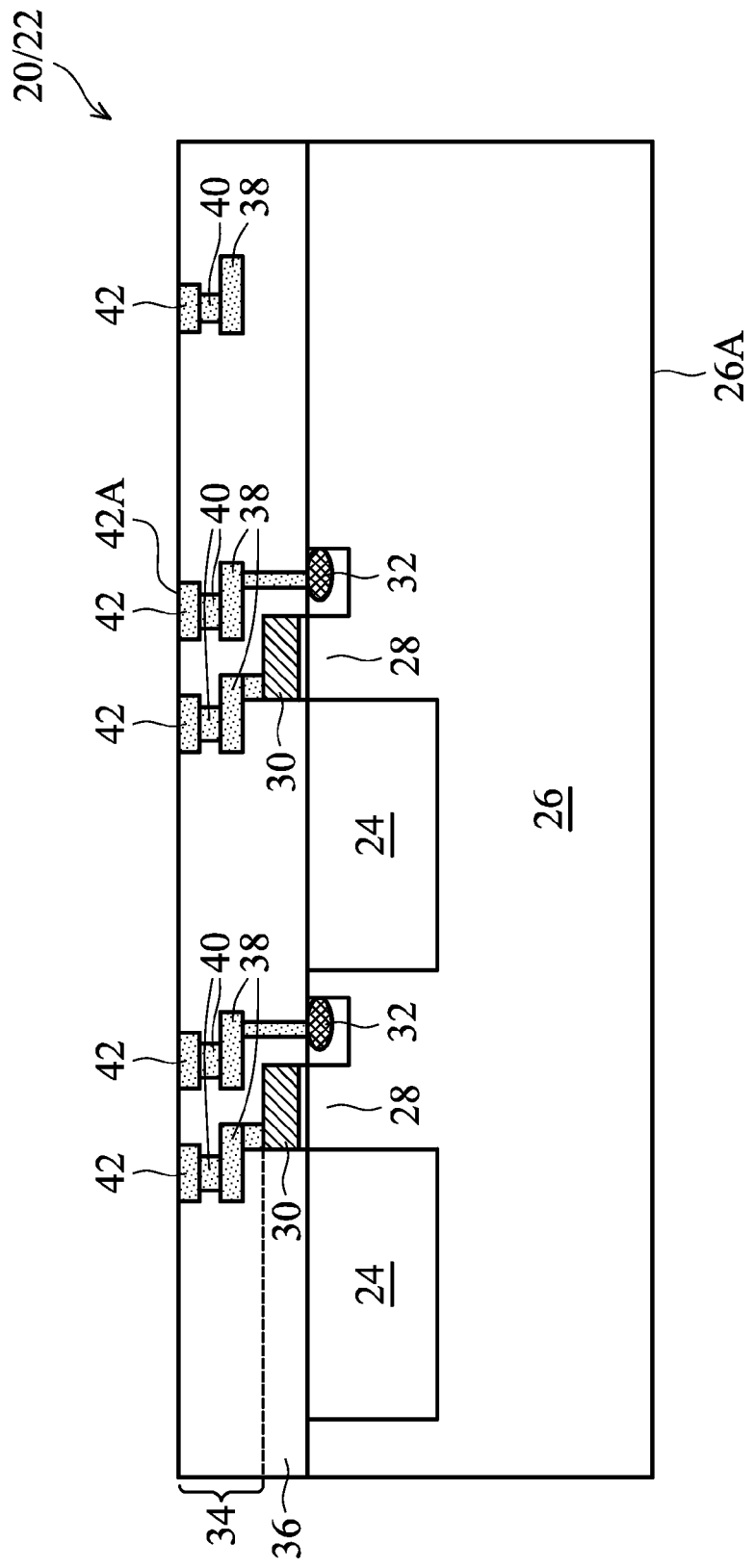
FIGS. 1 through 5 are cross-sectional views of intermediate stages in the manufacturing of a stacked image sensor wafer/chip in accordance with some exemplary embodiments.

FIGS. 1 through 5 illustrate the cross-sectional views of intermediate stages in the stacking of a BSI image sensor chip/wafer and a device die/wafer in accordance with some exemplary embodiments. FIG. 1 illustrates image sensor chip 20, which is a part of wafer 22 that includes a plurality of image sensor chips 20 therein. Image sensor chip 20 includes semiconductor substrate 26, which may be a crystalline silicon substrate or a semiconductor substrate formed of other semiconductor materials. Throughout the description, surface 26A is referred to as a front surface of semiconductor substrate 26, and surface 26B is referred to as a back surface of semiconductor substrate 26. Image sensors 24 are formed at front surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, throughout the description, image sensors 24 are alternatively referred to as photo diodes 24, although they may be other types of image sensors. In some exemplary embodiments, photo diodes 24 extend from front surface 26A into semiconductor substrate 26, and form an image sensor array, which is illustrated in a top view shown in FIG. 7.

In some embodiments, each of photo diodes 24 is electrically coupled to a first source/drain region of transfer gate transistor 28, which includes gate 30. The first source/drain region of transfer gate transistor 28 may be shared by the connecting photo diode 24. Floating diffusion capacitor 32 is formed in substrate 26, for example, through implanting into substrate to form a p-n junction, which acts as floating diffusion capacitor 32. Floating diffusion capacitor 32 may be formed in a second source/drain region of transfer gate transistor 28, and hence one of the capacitor plates of floating diffusion capacitor 32 is electrically coupled to the second source/drain region of transfer gate transistor 28.

In some embodiments, at least some, and possibly all, of the peripheral circuits used for the processing of the signals from photo diodes 24 are not formed in image sensor chip 20 and wafer 22. These peripheral circuits include the Image Signal Processing (ISP) circuits, which may include Analog-to-Digital Converters (ADCs), Correlated Double Sampling (CDS) circuits, row decoders, and the like.

Referring again to FIG. 1, front-side interconnect structure 34 is formed over semiconductor substrate 26, and is used to electrically interconnect the devices in image sensor chip 20. Front-side interconnect structure 34 includes dielectric layers 36, and metal lines 38 and vias 40 in dielectric layers 36. Throughout the description, the metal lines 38 in a same dielectric layer 36 are collectively referred to as being a metal layer. Interconnect structure 34 may include a plurality of metal layers. Dielectric layers 36 may include low-k dielectric layers and possibly a passivation layer(s) over the low-k dielectric layers. The low-k dielectric layers have low k values, for example, lower than about 3.0. The passivation layer may be formed of a non-low-k dielectric material having a k value greater than 3.9.

At the front surface of wafer 22 are metal pads 42, which may have their top surfaces substantially level with or higher than the top surface of a top layer among dielectric layers 36. Metal pads 42 may comprise copper, aluminum, and possibly other metals. In some embodiments, each of gates 30 of transfer gate transistors 28 is electrically coupled to one of metal pads 42. Some metal pads 42, such as metal pads 42A, may be connected to the substrate grounding, which is illustrated as GND in FIG. 6. Accordingly, gates 30 receive transfer signals through metal pads 42. Each of floating diffusion capacitor 32 is electrically coupled to one of metal pads 42, so that the charges stored in diffusion capacitor 32 may be discharged to chip 100 (not shown in FIG. 1, please refer to FIG. 3) through the respective coupling metal pads 42. Accordingly, each of the pixel units 200 (referring to FIGS. 3 and 7) may include two of metal pads 42. It is appreciated that the number of metal pads 42 in each of pixel units 200 is related to the configuration of pixel units 200. Accordingly, each of pixel units 200 may include a different number of metal pads 42, such as 3, 4, 5, etc.

Figure 2:
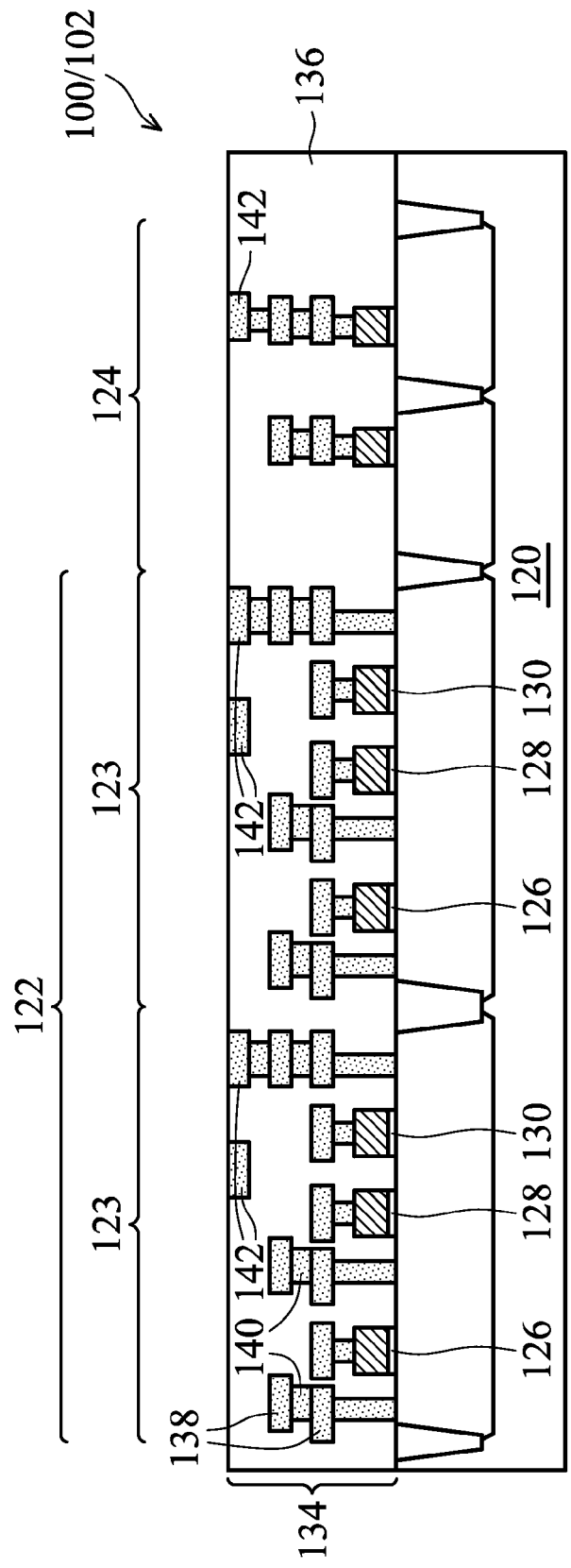

FIG. 2 illustrates a cross-sectional view of device chip 100, which is in wafer 102 that comprises a plurality of identical device chips identical to device chip 100. Device chip 100 includes substrate 120, and logic circuit 122 and peripheral circuit 124 formed at the front surface of substrate 120. Substrate 120 is a silicon substrate in some embodiments. Alternatively, substrate 120 is formed of other semiconductor materials such as silicon germanium, silicon carbon, III-V compound semiconductor materials, or the like. In accordance with some embodiments, logic circuit 122 includes a plurality of transistors, including row selectors 126, source followers 128, and reset transistors 130. Row selectors 126, source followers 128, and reset transistors 130 may form a plurality of pixel unit portions 123, with each of pixel unit portions 123 including one of row selectors 126, one of source followers 128, and one of reset transistors 130.

Logic circuit 124 may include one or more of ISP circuits such as ADCs, CDS circuits, row decoders, and the like. Interconnect structure 134 is formed over, and electrically coupled to, peripheral circuit 124 and pixel unit portions 123. Interconnect structure 134 includes a plurality of metal layers in a plurality of dielectric layers 136. Metal lines 138 and vias 140 are disposed in dielectric layers 136. In some exemplary embodiments, dielectric layers 136 include low-k dielectric layers. The low-k dielectric layers may have low k values lower than about 3.0. Dielectric layers 136 may further include a passivation layer formed of non-low-k dielectric materials having k values greater than 3.9. In some embodiments, the passivation layer includes a silicon oxide layer, an Un-doped Silicate Glass (USG) layer, for example.

Metal pads 142 are formed at the surface of wafer 102, wherein metal pads 142 may have their top surfaces substantially level with or higher than the top surface of the top one of dielectric layers 136. Metal pads 142 may also comprise copper, aluminum, and possibly other metals. In some embodiments, each of the pixel unit portions 123 is electrically connected to one or more of metal pads 142.

Figure 3:
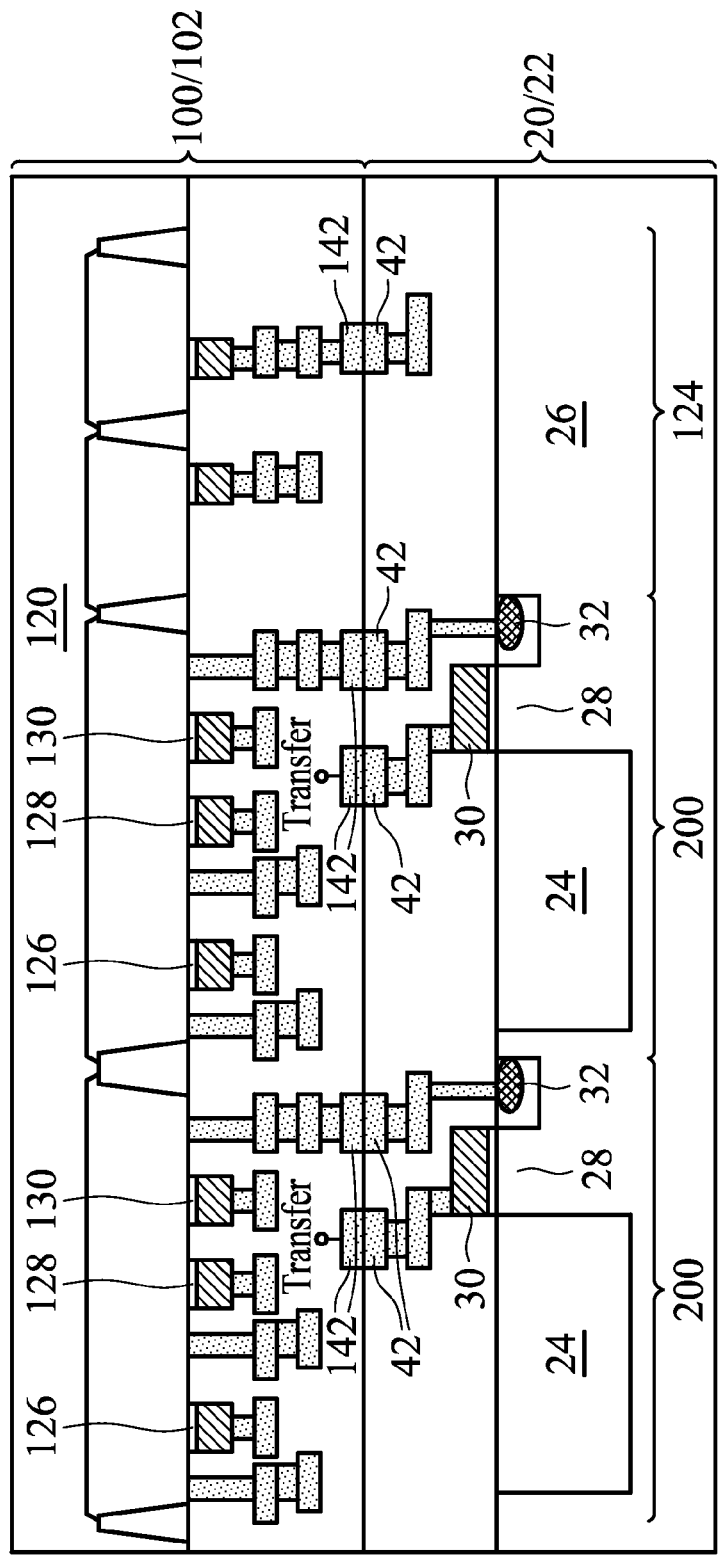
Figure 7:
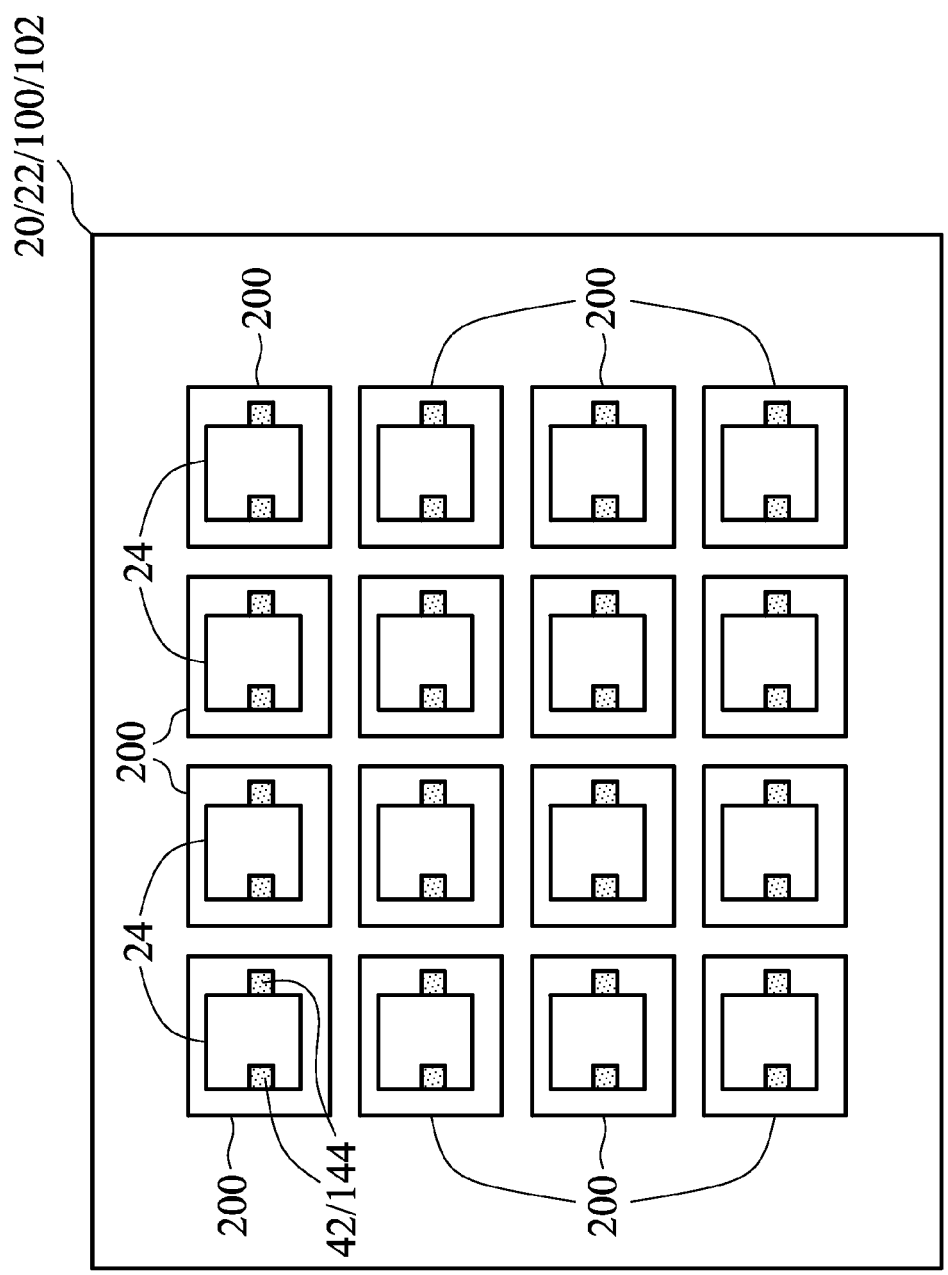
FIG. 7 illustrates a top view of an exemplary pixel unit, which is separated into two stacked chips.

Referring to FIG. 3, wafers 22 and 102 are bonded to each other through the bonding of metal pads 42 to respective metal pads 142. The bonding may be a metal-to-metal direct bonding, for example, by pressing metal pads 42 against metal pads 142 at an elevated temperature. As a result of the bonding, photo diodes 24, transfer gate transistors 28, floating diffusion capacitors 32, row selectors 126, source followers 128, and reset transistors 130 are coupled to form a plurality of pixel units 200. In some embodiments, pixel units 200 form arrays corresponding to the image sensor array, as shown in FIG. 7. Metal pads 42 and 142 may also be arranged as arrays.

Figure 6:
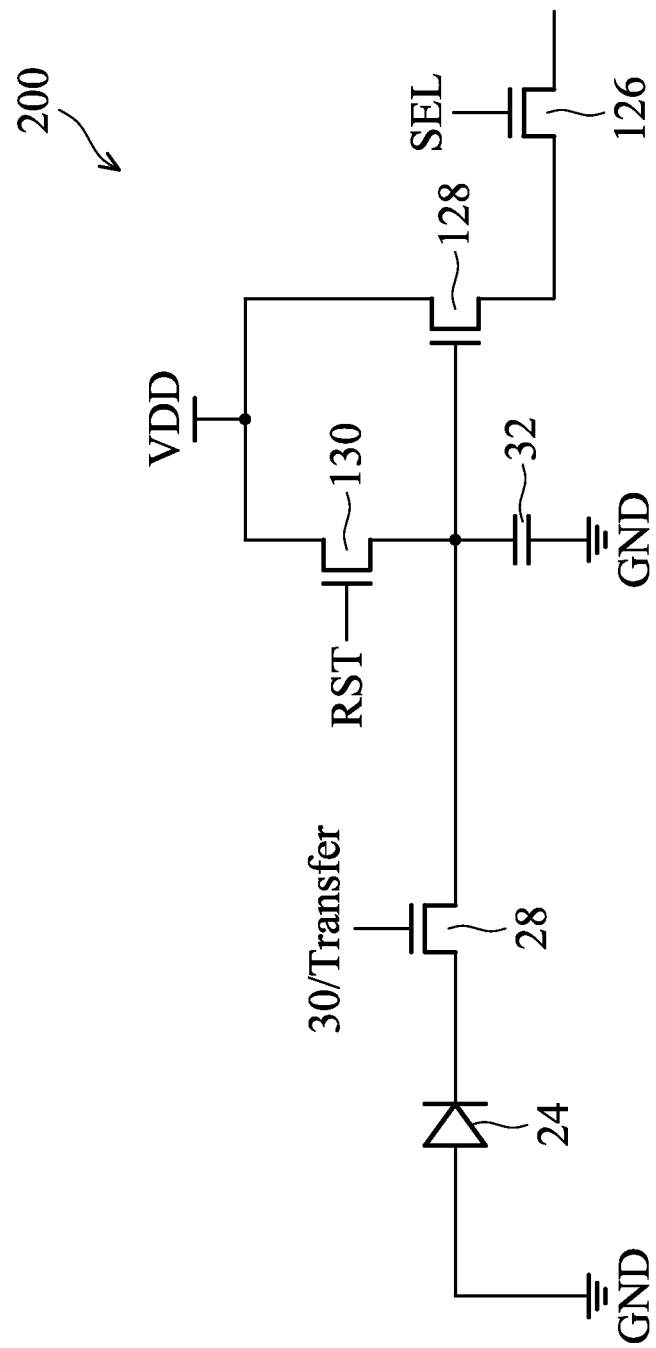
FIG. 6 illustrates a schematic circuit diagram of a pixel unit in accordance with some alternative exemplary embodiments.

FIG. 6 illustrates a circuit diagram of an exemplary pixel unit 200. In some exemplary embodiments, photo diode 24 has an anode coupled to the electrical ground, and a cathode coupled to a source of transfer gate transistor 28, which has gate 30 coupled to a single line. The single line is also shown in FIG. 3 and marked as "Transfer." The Transfer lines of the pixel units 200 may be connected to ISP circuits 124 in FIG. 3 to receive the control signals. As also shown in FIG. 6, the drain of transfer gate transistor 28 may be coupled to a drain of reset transistor 130 and a gate of the source follower 128. Reset transistor 130 has a gate coupled to a reset line RST, which may be connected to ISP circuits 124 (FIG. 3) to receive further control signals. A source of reset transistor 130 may be coupled to pixel power supply voltage VDD. Floating diffusion capacitor 32 may be coupled between the source/drain of transfer gate transistor and the gate of source follower 128. Reset transistor 130 is used to preset the voltage at floating diffusion to VDD. A drain of source follower 128 is coupled to a power supply voltage VDD. A source of source follower 128 is coupled to row selector 126. Source follower 128 provides a high-impedance output for pixel unit 200. The row selector 126 functions as the select transistor of the respective pixel unit 200, and the gate of the row selector 126 is coupled to select line SEL, which may be electrically coupled to ISP circuits 124. A drain of the row selector 126 is coupled to an output line, which is coupled to ISP circuits 124 in FIG. 3 to output the signal generated in photo diode 24.

In the operation of pixel unit 200, when light is received by photo diode 24, photo diode 24 generates electrical charges, wherein the amount of the charges is related to the intensity or the brightness of the incident light. The electrical charges are transferred by enabling transfer gate transistor 28 through a transfer signal applied to the gate of the transfer gate transistor 28. The electrical charges may be stored in floating diffusion capacitor 32. The electrical charges enables source follower 128, thereby allowing an electrical charges generated by the photo diodes 24 to pass through source follower 128 to row selector 126. When sampling is desired, the select line SEL is enabled, allowing the electrical charges to flow through row selector 126 to the data process circuits, for example, the ISP circuits 124, which are coupled to the output of the row selector 126.

It should be noted that although FIGS. 3 and 6 illustrate a schematic diagram of an exemplary pixel unit 200 in a BSI image sensor chip, the pixel units 200, which are separated to chips 20 and 100, may also be used in other types of image sensor chips such as front side illumination image sensor chips. It should be noted further that while FIGS. 3 and 6 illustrate a pixel in a four-transistor structure, a person skilled in art will recognize that the four-transistor diagram is merely an example, which should not unduly limit the scope of the embodiments. One skilled in the art would recognize many variations, alternatives, and modifications. For example, various embodiments may include but not limited to three-transistor pixel, five-transistor pixel and the like.

Figure 4:
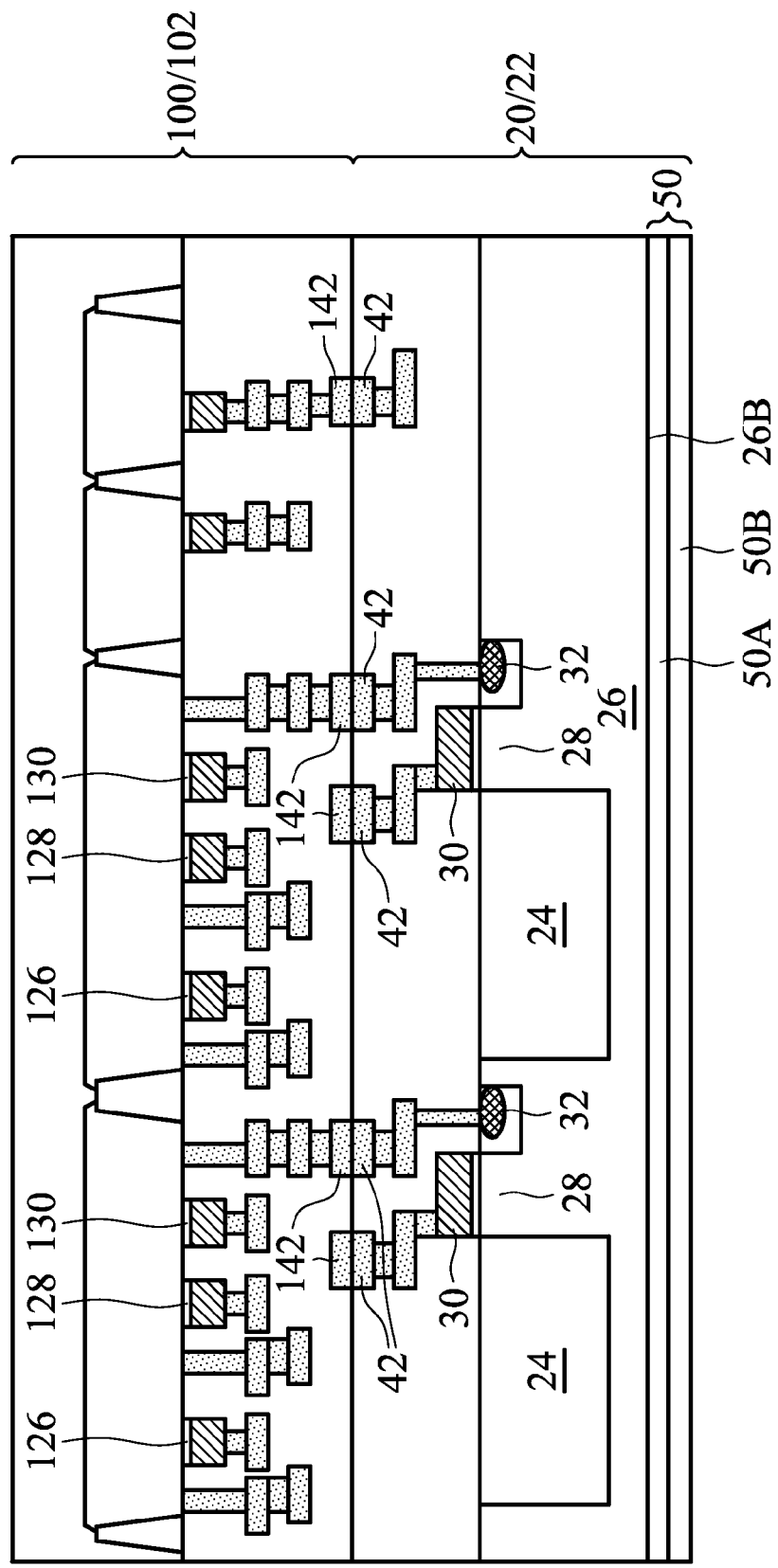

Next, as shown in FIG. 4, a backside grinding is performed to thin down semiconductor substrate 26, and the thickness of substrate 26 is reduced. With semiconductor substrate 26 having a small thickness, light may penetrate from back surface 26B into semiconductor substrate 26, and reach image sensors 24. In the thin down process, wafer 102 acts as a carrier that provides mechanical support to wafer 22, and hence preventing wafer 22 from breaking even through wafer 22 has a very small thickness during and after thinning. Accordingly, during the backside grinding, no additional carrier is needed.

After the thinning of substrate 26, upper layers 50 (sometimes referred to as buffer layers) are formed on the back surface of semiconductor substrate 26. In some exemplary embodiments, upper layers 50 include one or more of Bottom Anti-Reflective Coating (BARC), silicon oxide layer, and silicon nitride layer, which are symbolized by layers 50A and 50B.

Figure 5:
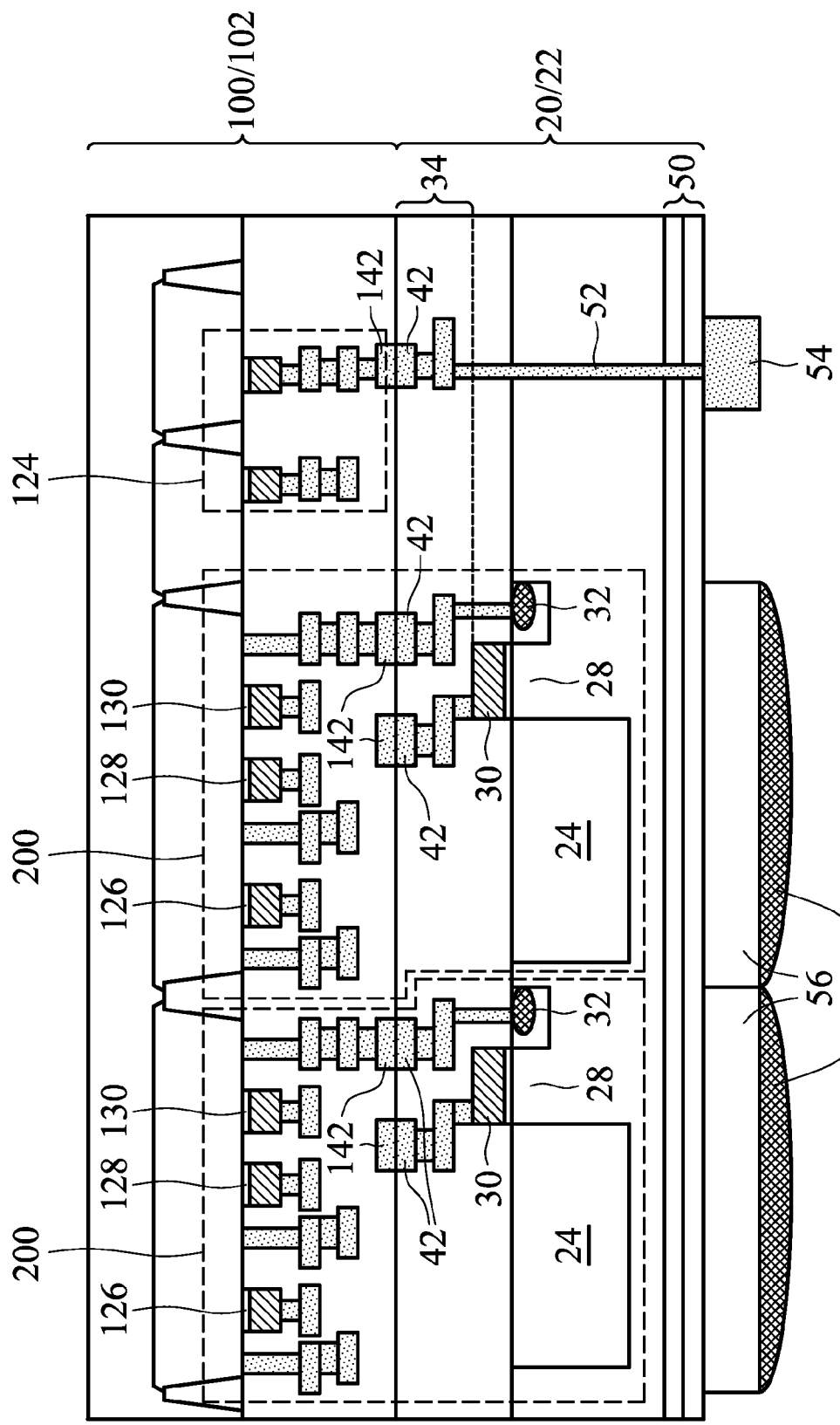

FIG. 5 illustrates the formation of through via 52, which penetrate through upper layers 50 and semiconductor substrate 26. Via 52 may also penetrate some of interconnect structure 34. As a result, via 52 is electrically coupled to metal pads 42 and 142, and electrically coupled to the circuits in wafer 102. The formation of via 52 may include performing an etch step to form a via opening (occupied by via 52), and filling a conductive material, which may comprise aluminum, copper, aluminum copper, tungsten, nickel, gold, and/or the like, into the via opening. Next, electrical connector 54 is formed, for example, by depositing a conductive material such as aluminum copper, and then patterning the conductive material. Electrical connector 54 may be a bond pad, for example, a wire bond pad used for forming wire bonding. Through electrical connector 54 and other un-illustrated electrical connectors, the respective chip 20 and chip 100 are electrically coupled to external circuit components (not shown).

Referring again to FIG. 5, in accordance with some exemplary embodiments, before or after the formation of electrical connector 54, additional components such as metal grids (not shown), color filters 56, micro-lenses 58, and the like, are further formed on the backside of chip 20. The resulting stacked wafers 22 and 102 are then sawed apart into dies, wherein each of the dies includes one chip 20 and one chip 100.

In the embodiments, by moving at least some of, or possibly all of, row selectors 126, source followers 128, reset transistors 130 out of chip 20, the fill factor of pixel units 200 are improved, wherein the fill factor may be calculated as the chip area occupied by photo diode 24 divided by the total chip area of the respective pixel unit 200. The improvement in the fill factor results in the increase in quantum efficiency, the signal-to-noise ratio, the sensitivity, and the dynamic range of the pixels. Furthermore, since row selectors 126, source followers 128, reset transistors 130, and peripheral circuits 124 are logic devices whose formation is decoupled from the formation of photo diodes 24 and transfer gate transistors 28, the adverse effect to the performance of photo diodes 24 caused by the formation of the logic devices is eliminated.

In accordance with embodiments, a device includes a first chip including an image sensor therein, and a second chip bonded to the first chip. The second chip includes a logic device selected from the group consisting essentially of a reset transistor, a selector, a row selector, and combinations thereof therein. The logic device and the image sensor are electrically coupled to each other, and are parts of a same pixel unit.

In accordance with other embodiments, a device includes a first chip bonded to a second chip. The first chip includes a sensor array including a plurality of image sensors, and a plurality of transfer gate transistors. Each of the plurality of transfer gate transistors is electrically coupled to one of the plurality of image sensors. The first chip further includes a first plurality of metal pads at a front surface of the first chip. The first plurality of metal pads is electrically coupled to the plurality of image sensors and the plurality of transfer gate transistor. The second chip includes a plurality of reset transistors, a plurality of source followers, and a plurality of row selectors electrically coupled to the plurality of image sensors and the plurality of transfer gate transistors to form a pixel unit array. The pixel unit array includes a plurality of pixel units. The second chip further includes a second plurality of metal pads at a front surface of the second chip, wherein the second plurality of metal pads is electrically coupled to the plurality of reset transistor, the plurality of source followers, and the plurality of row selectors. Each of the second plurality of metal pads is bonded to one of the first plurality of metal pads.

In accordance with yet other embodiments, a method includes bonding a first chip to a second chip. The first chip includes a first semiconductor substrate, and an image sensor disposed at a surface of the first semiconductor substrate. The second chip includes a second semiconductor substrate, and a logic device selected from the group consisting essentially of a reset transistor, a source follower, a row selector, and combinations thereof at a surface of the second semiconductor substrate. The logic device and the image sensor are electrically coupled to each other, and form parts of a same pixel unit. After the step of bonding, a bond pad is formed at a surface of the first chip, wherein the bond pad is electrically coupled to devices in the second chip.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    bonding a first chip to a second chip, wherein the first chip comprises:
        a semiconductor substrate;
        an image sensor in the semiconductor substrate; and
        a transfer gate transistor electrically coupled to the image sensor, wherein the second chip comprises:
            a logic device selected from the group consisting essentially of a reset transistor, a source follower, a row selector, and combinations thereof, wherein the logic device, the transfer gate transistor, and the image sensor are electrically coupled to each other, and form a same pixel unit; and
    forming a through-via penetrating through the semiconductor substrate and electrically coupled to devices in the second chip.

2. The method of claim 1 further comprising an Image Signal Processing (ISP) circuit in the second chip, wherein the ISP circuit comprises a circuit selected from the group consisting essentially of an Analog-to-Digital Converter (ADC), a Correlated Double Sampling (CDS) circuit, a row decoder, and combinations thereof, and wherein substantially no ISP circuit is in the first chip.

3. The method of claim 1 further comprising forming a bond pad at a surface of the first chip, with the bond pad and the second chip being on opposite sides of a semiconductor substrate in the first chip.

4. The method of claim 3 wherein the bond pad is electrically connected to the through-via.

5. The method of claim 4, wherein the through-via lands on a metal pad in the first chip.

6. The method of claim 1 further comprising, after bonding, forming color filters and micro-lenses at a surface of the first chip, wherein the color filters and the second chip are on opposite sides of a semiconductor substrate in the first chip.

7. The method of claim 1, wherein the first chip further comprises a floating diffusion capacitor therein, and the floating diffusion capacitor is electrically coupled to a source/drain of the transfer gate transistor, and wherein the floating diffusion capacitor is a part of the same pixel unit.

8. A method comprising:
    forming a first chip comprising:
        a first semiconductor substrate;
        an image sensor in the first semiconductor substrate; and
        a transfer gate transistor electrically coupled to the image sensor;
    forming a second chip comprising:
        a second semiconductor substrate;
        a logic device at a surface of the second semiconductor substrate, wherein the logic device comprises a reset transistor, a source follower, and a row selector; and
    bonding the second chip to the first chip, wherein the transfer gate transistor is electrically coupled to the image sensor and the logic device to form a same pixel unit, wherein metal pads bonding the first chip to the second chip are between the first semiconductor substrate and the second semiconductor substrate.

9. The method of claim 8, wherein a gate of the transfer gate transistor is electrically coupled to a first metal pad in the first chip, with the first metal pad bonded to a second metal pad in the second chip in the bonding, and wherein the gate of the transfer gate transistor is configured to receive control signals from the second chip.

10. The method of claim 8, wherein the same pixel unit is electrically coupled to two metal pads at a surface of the first chip, wherein the logic device is electrically coupled to two additional metal pads at a surface of the first chip, and wherein each of the two metal pads is bonded to one of the two additional metal pads.

11. The method of claim 8 further comprising an Image Signal Processing (ISP) circuit in the second chip, wherein the ISP circuit comprises a circuit selected from the group consisting essentially of an Analog-to-Digital Converter (ADC), a Correlated Double Sampling (CDS) circuit, a row decoder, and combinations thereof.

12. The method of claim 11, wherein substantially no ISP circuit is in the first chip.

13. The method of claim 8, wherein the same pixel unit is electrically connected to two metal pads, with each being bonded to the second chip.

14. A method comprising:
    forming a first chip comprising:
        an image sensor;
        a transfer gate transistor electrically coupled to the image sensor;
        a floating diffusion capacitor electrically coupled to the transfer gate transistor; and
        a first bond pad and a second bond pad at a surface of the first chip, wherein the first bond pad and the second bond pad are electrically connected to a gate of the transfer gate transistor and the floating diffusion capacitor, respectively; and
    forming a second chip comprising:
        a reset transistor, a source follower, and a row selector electrically coupled to each other;
        a third bond pad and a fourth bond pad at a surface of the second chip, wherein the fourth bond pad is electrically connected to a source/drain region of the reset transistor; and
    bonding the second chip to the first chip by bonding the third bond pad and the fourth bond pad to the first bond pad and the second bond pad, respective.

15. The method of claim 14, wherein the third bond pad is configured to receive control signals from the second chip.

16. The method of claim 14 further comprising:
    forming a through-via penetrating through a first semiconductor substrate in the first chip and electrically coupled to devices in the second chip; and
    forming an addition bond pad at a surface of the first chip, wherein the additional bond pad is connected to the through-via.

17. The method of claim 16, wherein the through-via lands on a metal pad in the first chip.

18. The method of claim 14 further comprising, after bonding, forming color filters and micro-lenses at a surface of the first chip, wherein the color filters and the second chip are on opposite sides of a semiconductor substrate in the first chip.

19. The method of claim 14, wherein the second chip further comprises an Image Signal Processing (ISP) circuit, wherein the ISP circuit comprises a circuit selected from the group consisting essentially of an Analog-to-Digital Converter (ADC), a Correlated Double Sampling (CDS) circuit, a row decoder, and combinations thereof.

20. The method of claim 19, wherein substantially no ISP circuit is in the first chip.

* * * * *